United States Patent
Sarkas et al.

(10) Patent No.: US 10,652,065 B2
(45) Date of Patent: May 12, 2020

(54) SYSTEMS AND METHODS FOR COMPRESSION DISTORTION COMPENSATION FOR WIRELESS SIGNALS

(71) Applicant: Apple Inc., Cupertino, CA (US)

(72) Inventors: Ioannis Sarkas, Redwood City, CA (US); Berke Cetinoneri, Santa Clara, CA (US); Qishan Yu, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/135,973

(22) Filed: Sep. 19, 2018

(65) Prior Publication Data

US 2020/0092153 A1   Mar. 19, 2020

(51) Int. Cl.

| | |
|---|---|
| H04K 1/10 | (2006.01) |
| H04L 27/26 | (2006.01) |
| H04B 7/155 | (2006.01) |
| H03G 3/30 | (2006.01) |
| H04B 17/318 | (2015.01) |
| H04B 1/04 | (2006.01) |

(52) U.S. Cl.
CPC ....... *H04L 27/2614* (2013.01); *H03G 3/3042* (2013.01); *H04B 7/15585* (2013.01); *H04B 17/318* (2015.01); *H04B 1/0475* (2013.01)

(58) Field of Classification Search
CPC .............. H04L 27/2614; H04B 17/318; H04B 7/15585; H04B 1/0475; H03G 3/3042
USPC ........................................................ 375/260
See application file for complete search history.

(56) References Cited

U.S. PATENT DOCUMENTS

| | | | |
|---|---|---|---|
| 5,151,664 A * | 9/1992 | Suematsu | H03F 1/3247 327/105 |
| 7,634,240 B2 | 12/2009 | Mitzlaff et al. | |
| 8,224,266 B2 * | 7/2012 | Liu | H03F 1/3247 330/149 |
| 2004/0076247 A1 * | 4/2004 | Barak | H04L 27/2623 375/350 |
| 2015/0048890 A1 * | 2/2015 | Takeuchi | H03F 1/32 330/291 |
| 2016/0249300 A1 | 8/2016 | Tsai et al. | |
| 2017/0093505 A1 | 3/2017 | Ripley et al. | |
| 2018/0241347 A1 * | 8/2018 | Petrovic | H04L 27/2332 |

FOREIGN PATENT DOCUMENTS

WO       2017030935 A1     2/2017

\* cited by examiner

*Primary Examiner* — Helene E Tayong
(74) *Attorney, Agent, or Firm* — Fletcher Yoder PC

(57) ABSTRACT

Systems, methods, and devices are provided for correcting compression distortion of wireless signals due to variations in operation parameters of the radio frequency system. The method may include using circuitry to generate a reference signal that is not pre-distorted by a processing block. The method may involve receiving an envelope signal representative of a signal being transmitted by a transceiver. The method may also involve determining a first peak-to-average ratio of the envelope signal and receiving a second peak-to-average ratio of the reference signal. The method may additionally involve determining a difference between the first peak-to-average ratio and the second peak-to-average ratio. The method may also include adjusting a gain of an amplifier of the transceiver based on the difference.

20 Claims, 7 Drawing Sheets

US 10,652,065 B2

SYSTEMS AND METHODS FOR COMPRESSION DISTORTION COMPENSATION FOR WIRELESS SIGNALS

BACKGROUND

The present disclosure relates generally to radio frequency systems and, more particularly, to mitigating unwanted distortion of wireless signals caused by variations in operation parameters of the radio frequency system.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Electronic devices, such as smartphones and laptops, often include a radio frequency system to facilitate wireless communication of data with other electronic devices and/or networks. To facilitate wireless communication, the radio frequency system may rely on certain wireless communication technologies, such as fifth-generation wireless technology (5G). For example, electronic devices may use 5G technology to wirelessly stream movies, send emails, transfer images to other devices, and the like. The radio frequency system may employ multiple transceivers (e.g., devices that transmit and receive wireless signals) and antennas to communicate data based on the specified wireless technology. When elements (e.g., transceivers) of the radio frequency system are sensitive to system parameters and/or environmental conditions, the radio frequency system may process the wireless signals in an unintended manner, leading to significant distortion of the wireless signals and potential loss of information encoded in the wireless signals.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

The present disclosure generally relates to mitigating wireless signal distortion resulting from variations in operation parameters (e.g., power amplifier gains) of a radio frequency system by dynamically correcting the operation parameter based on the detected distortion extracted from a transmitted wireless signals. Transceivers may use power amplifiers to amplify wireless signals prior to transmission to better ensure that a receiving component acquires the desired signals. However, in some embodiments, the amplification of the wireless signals by the power amplifiers may vary based on environmental conditions (e.g., temperature) and/or on system parameters (e.g., antenna reflection coefficients (VSWR)). In some instances, the amplification (e.g., gain) variation may distort (e.g., compress, clip, expand) the wireless signals, such that transmission and/or reception of the wireless signals are affected.

To more accurately facilitate wireless signal processing, in some embodiments, the gain of one or more power amplifiers may be adjusted to reduce likelihood of undesired gain compression and/or gain expansion of the wireless signals during amplification. In some embodiments, the processor may instruct peak-to-average power ratio (PAPR) detection circuitry to periodically determine distortion information (e.g., a peak-to-average power ratio) for an output signal transmitted by the radio frequency system (output TX signal). For example, the distortion information may be extracted from a recovered envelope signal generated by the peak-to-average power ratio detection circuitry and associated with the output TX signal that is encoded with information of the distortion by the transmitting radio frequency system. By comparing the distortion information to a reference transmission distortion level (e.g., a reference peak-to-average power ratio for a reference TX signal), the radio frequency system may determine the level of undesired gain compression and/or gain expansion of the wireless signals using readily available signals (e.g., output TX signal).

In some embodiments, based on the distortion information, the peak-to-average power ratio detection circuitry may vary the amplification gain of a transceiver block to prevent unwanted distortion of the wireless signals. Further, in wireless technologies that use multiple transceiver blocks, the same peak-to-average power ratio detection circuitry may determine the distortion information and appropriate correction for each transceiver block in a time-multiplexing manner.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
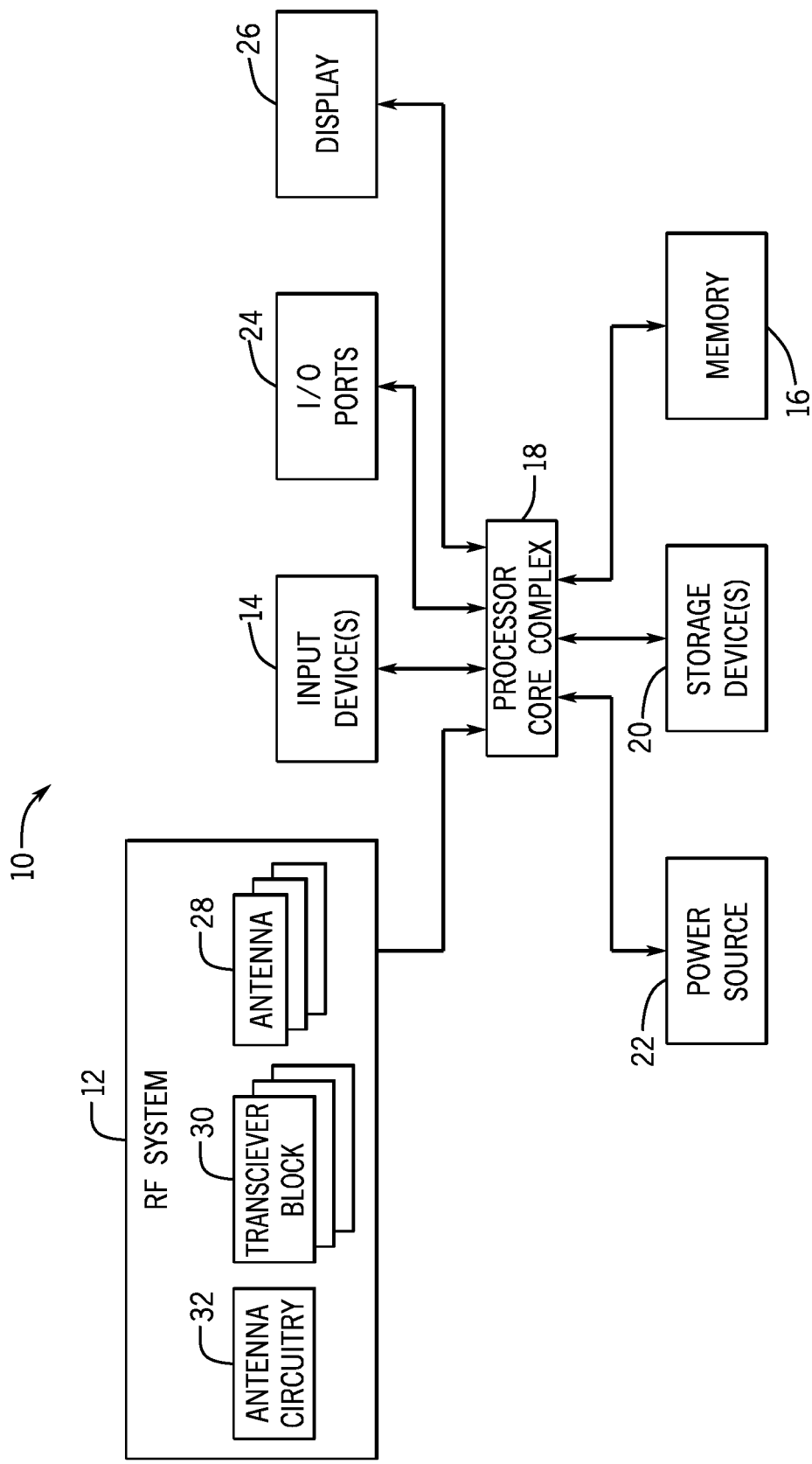
FIG. 1 is a block diagram of an electronic device with a radio frequency system, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

The present disclosure generally relates to radio frequency systems used to facilitate wireless communication of data between electronic devices and/or with a network. For example, a radio frequency system may wirelessly communicate data by transmitting wireless signals (e.g., radio waves) modulated in a manner representative of the data, for example, via a personal area network (e.g., Bluetooth network), a local area network (e.g., an 802.11x Wi-Fi network), and/or a wide area network (e.g., a 4G, 5G, or LTE cellular network).

In particular, electronic devices may implement millimeter-wave (mmWave) wireless communication technologies due to large amounts of available bandwidth in millimeter frequency bands that support high rates of information transfer. As an example, electronic devices may use fifth-generation wireless technology (5G) to facilitate better connection and more efficient data transfer between electronic devices. In certain electronic devices, the radio frequency system may be tailored to better suit wireless transmission via mmWave communication technology. For example, an electronic device using 5G wireless technology may employ multiple transceiver blocks and multiple antennas to transmit and receive data. The multiple transceiver blocks and multiple antennas may form a phased array antenna that uses the multiple components to form transmission and reception beams. These beams compensate for data loss occurring over the air at 5G frequencies as they allow for direct communication of data with another device.

The phased array antennas may also employ one or more power amplifiers per transceiver block to amplify (e.g., increase amplitude) an output (TX) signal (e.g., output via the beam) for better coverage and detection of signal over noise. Briefly, the power amplifiers may operate in a linear region whereby a small input signal is linearly scaled to a larger output signal without distortion of the signal. Linear applications of the power amplifier may be highly useful in radio frequency modulation schemes that encode information in the wireless signal amplitudes, such as amplitude modulation (AM). In some instances, when the input power to the power amplifier is increased beyond a threshold power (e.g., input compression power), the amplification gain provided by the power amplifier may no longer be linear. In such cases, the wireless signal may experience gain compression or gain expansion, resulting in output of a non-linear, distorted signal that may no longer include all information of the input waveform and may interfere with other radio channels. For example, a power amplifier operating in the non-linear region may distort a sinusoid input to a non-sinusoidal output.

Power amplifiers, however, may operate more efficiently near and/or in the non-linear region. Thus, implementation of power amplifiers in the radio frequency system may involve a compromise between linearity and high-efficiency. For example, because the power amplifiers used in the mm-wave phased array antennas have lower operating efficiencies than power amplifiers used in systems operating at lower frequencies, the power amplifiers may operate in deep compression (e.g., gain compression equal or greater than 3 dB) to improve efficiency. A linearization algorithm, such as digital pre-distortion (DPD), may be implemented during online operation of the radio frequency system to linearize output of the power amplifiers operating in deep compression.

In some instances, digital pre-distortion capture may be set, for example, during design or manufacturing. As a result, digital pre-distortion may be implemented as an open loop technique that pre-corrects wireless signal distortion based on a static model of expected power amplifier distortion. That is, the radio frequency system may pre-distort wireless signals using correction coefficients stored in a lookup table holding expected amplification and phase distortion by the power amplifier gain.

Because the expected distortion by the power amplifier gain is determined during the design process and/or during factory calibration, as the power amplifier gain varies (e.g., between 2 dB-4 dB) due to temperature and antenna reflection coefficient (VSWR) variations caused by, for example, heat dissipation by the radio frequency system and impedance mismatch during online operation, corrections to distorted wireless signals using open loop digital pre-distortion techniques may become increasingly inaccurate. In other words, in instances where environmental conditions and system parameters vary, behavior of the power amplifier may vary significantly from the static model used to pre-correct the wireless signal, resulting in the re-introduction of and/or inability to reduce distortion due to gain compression and/or gain expansion.

With the foregoing in mind, closed loop digital pre-distortion techniques may be used to correct distorted wireless signals when the power amplifier gain begins to vary. In some embodiments, a feedback loop between the output of the power amplifier and a digital pre-distortion processing block may correct for the wireless signal distortion. For example, the feedback loop may convey information about the compression of wireless signals by the power amplifier to the digital pre-distortion processing block, which may use alternative correction factors to compensate for the distortion caused by the power amplifier's operation. In many instances, however, the closed loop technique may be difficult to implement, as compared to an open loop technique, because it may involve higher bandwidth converters and may use more computation overhead. Further, the closed loop technique may use high frequency cables/traces that are less cost-effective and more susceptible to noise, rendering the closed loop digital pre-distortion feedback capture as an impracticable option for mitigating distortion.

Accordingly, the present disclosure provides systems and techniques to compensate for wireless signal distortion caused by variations in the power amplifier gain due to environmental conditions and/or system parameters. In some embodiments, the radio frequency system of an electronic device may determine wireless signal distortion levels resulting from variations in processing (e.g., amplifying) the wireless signal. In particular, a phased array antenna of the radio frequency system may be modified by a peak-to-average power ratio (PAPR) detection circuit that determines distortion information from a reference transmission signal generated by the radio frequency system (reference TX signal) and from a recovered output signals transmitted by the radio frequency system (output TX signals). Because the distortion information is determined by comparing the reference TX signal that encodes reference information on distortion by the radio frequency system and the output TX signal that is encoded with information related to the distortion variation by the radio frequency system, the radio frequency system may determine the level of undesired gain compression and/or gain expansion of the wireless signals using these two signals. In some embodiments, a peak-to-average power ratio detection circuit may include an envelope detector to generate envelope signals representative of, for example, switch leakage current or a current associated with a directional coupler that receives the output TX signal. The peak-to-average power ratio detection circuit may also include an analog-to-digital (ADC) converter to digitize the envelope signal and a peak-to-average power ratio measurement unit that generates distortion information for the digitized envelope signal.

After generating the distortion information, the radio frequency system may compensate for processing variations (e.g., gain) based on the distortion detected in the output TX signal. As such, in some embodiments, the peak-to-average power ratio detection circuit may adjust the gain of an amplifier used to amplify signals that are to be transmitted by the radio frequency system to compensate for the processing variations. The amplifier gain may be varied based on the distortion information, thereby compensating the amplifier gain to correct for the expected distortion in a transmission line of the radio frequency system. Additional details with regard to the gain adjustments performed using the embodiments described herein are detailed below with reference to FIGS. 1-9.

With this in mind, an embodiment of an electronic device 10 that includes a radio frequency system 12 is shown in FIG. 1. As will be described in more detail below, the electronic device 10 may be any suitable electronic device, such as a computer, a mobile phone, a portable media device, a tablet, a television, a virtual-reality headset, a vehicle dashboard, and the like. Thus, it should be noted that FIG. 1 is merely one example of a particular implementation and is intended to illustrate the types of components that may be present in an electronic device 10.

In the depicted embodiment, the electronic device 10 includes the radio frequency system 12, one or more input devices 14, local memory 16, a processor core complex 18, one or more main memory storage devices 20, a power source 22, one or more input/output ports 24, and an electronic display 26. The various components described in FIG. 1 may include hardware elements (e.g., circuitry), software elements (e.g., a tangible, non-transitory computer-readable medium storing instructions), or a combination of both hardware and software elements. It should be noted that the various depicted components may be combined into fewer components or separated into additional components. For example, the local memory 16 and a main memory storage device 20 may be included in a single component.

As depicted, the processor core complex 18 is operably coupled with local memory 16 and the main memory storage device 20. Thus, the processor core complex 18 may execute instruction stored in local memory 16 and/or the main memory storage device 20 to perform operations, such as instructing the radio frequency system 12 to communicate with another electronic device and/or a network. As such, the processor core complex 18 may include one or more general purpose microprocessors, one or more application specific processors (ASICs), one or more field programmable logic arrays (FPGAs), or any combination thereof.

In addition to the instructions, the local memory 16 and/or the main memory storage device 20 may store data to be processed by the processor core complex 18. Thus, in some embodiments, the local memory and/or the main memory storage device 20 may include one or more tangible, non-transitory, computer-readable mediums. For example, the local memory 16 may include random access memory (RAM) and the main memory storage device 20 may include read only memory (ROM), rewritable non-volatile memory such as flash memory, hard drives, optical discs, and the like.

As depicted, the processor core complex 18 is also operably coupled with the I/O ports 24. In some embodiments, the I/O ports 24 may enable the electronic device 10 to interface with other electronic devices. For example, a portable storage device may be connected to an I/O port 24, thereby enabling the processor core complex 18 to communicate data with a portable storage device.

Additionally, as depicted, the processor core complex 18 is operably coupled to the power source 22. In some embodiments, the power source 22 may provide power to one or more components in the electronic device 10, such as the processor core complex 18 and/or the radio frequency system 12. Thus, the power source 22 may include any suitable energy source, such as a rechargeable lithium polymer (Li-poly) battery and/or an alternating current (AC) power converter.

Furthermore, as depicted, processor core complex 18 is operably coupled with the input devices 14. In some embodiments, the input device 14 may facilitate user interaction with the electronic device 10, for example, by receiving user inputs. Thus, the input devices 14 may include a button, a keyboard, a mouse, a trackpad, and/or the like. Additionally, in some embodiments, the input devices 14 may include touch-sensing components in the electronic display 26. In such embodiments, the touch-sensing components may receive user inputs by detecting occurrence and/or position of an object touching the surface of the electronic display 26.

In addition to enabling user inputs, the electronic display 26 may display image frames, such as a graphical user interface (GUI) for an operating system, an application interface, a still image, or video content. As depicted, the electronic display 26 is operably coupled to the processor core complex 18. In this manner, the electronic display 26 may display image frames based at least in part on image data received from the processor core complex 18.

As depicted, the processor core complex 18 is also operably coupled with the radio frequency system 12. As described above, the radio frequency system 12 may facilitate wireless communication of data with another electronic device and/or a network. For example, the radio frequency system 12 may enable the electronic device 10 to communicatively couple to a personal area network (PAN), such as a Bluetooth network, a local area network (LAN), such as an 802.11x Wi-Fi network, and/or a wide area network (WAN), such as a fourth generation wireless technology (4G), 5G, or LTE cellular network. In other words, the radio frequency system 12 may enable wirelessly communicating data using various communication protocols and/or at various output powers (e.g., strength of transmitted analog electrical signals).

As mentioned previously, the radio frequency system 12 may be tailored to better support wireless transmission via certain wireless technologies. In one embodiment, the radio frequency system 12 may include hardware and/or software that supports millimeter-wave (mmWave) communications on high frequency bands (e.g., 10-400 GHz), such as 5G technology. Thus, in some embodiments, the radio frequency system 12 may include one or more antennas 28, a transceiver block 30 associated with each of the one or more antennas 28, and antenna circuitry (e.g., power combiners/dividers) 32. The radio frequency system 12 may thus transmit and/or receive signals via the one or more antennas 28.

Further, the radio frequency system 12 may include one or more transceiver blocks 30, each connected to a respective antenna 28, that facilitate wireless signal transmission and reception. For example, the one or more antennas 28 and the one or more transceiver block 30 may be part of a phased array antenna that transmits and/or receives wireless signals via beams. The beams may be formed by constructive/destructive interference of signals transmitted and/or received by each antenna 28. Additionally, the radio frequency system 12 may include antenna circuitry 32 that further processes the wireless signals to filter noise, amplify signals and the like. By way of example, the antenna circuitry 32 may linearize the wireless signals via digital pre-distortion (DPD) techniques.

Figure 2:
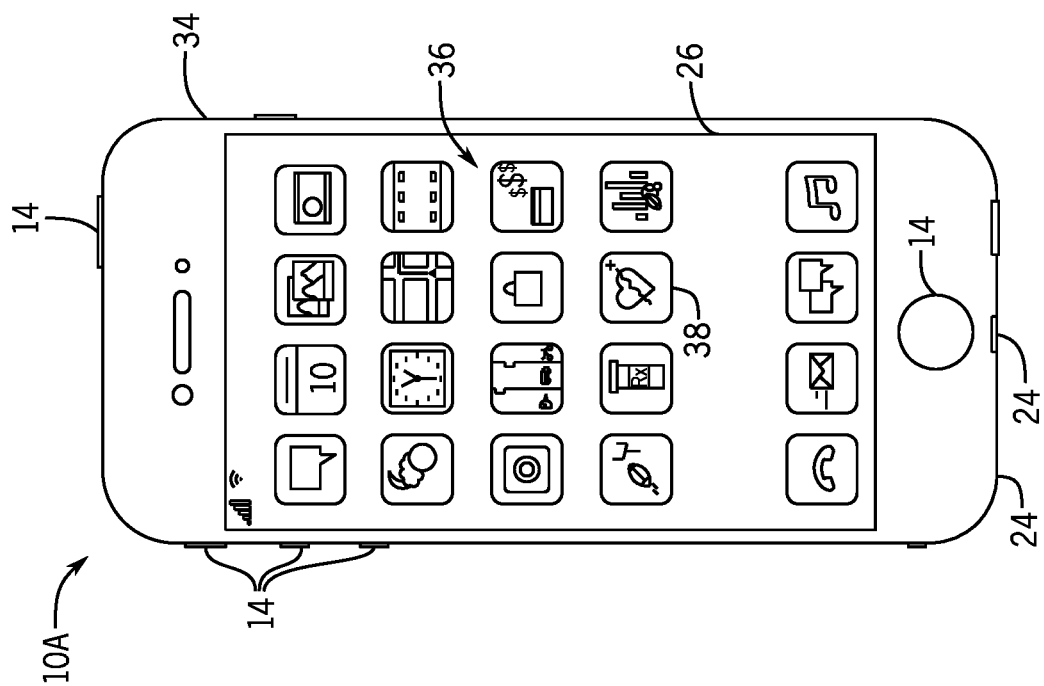
FIG. 2 is a front view of a hand-held device representing an example of the electronic device of FIG. 1, in accordance with an embodiment.

As described above, the electronic device 10 may be any suitable electronic device. To help illustrate, one example of a suitable electronic device 10, specifically a handheld electronic device 10A, is shown in FIG. 2. In some embodiments, the handheld electronic device 10A may be a portable phone, a media player, a personal data organizer, a handheld game platform, and/or the like. For example, the handheld electronic device 10A may be a smart phone, such as any iPhone® model available from Apple Inc.

As depicted, the handheld electronic device 10A includes an enclosure 34 (e.g., housing). In some embodiments, the enclosure 34 may protect interior components from physical damage and/or shield them from electromagnetic interference. Thus, a radio frequency system 12 (not shown) may also be enclosed within the enclosure 34 and internal to the handheld electronic device 10A. In some examples, the enclosure 34 may operate as part of the one or more antenna 28 of the radio frequency system 12.

Additionally, as depicted, the enclosure 34 may surround the electronic display 26. In the depicted embodiment, the electronic display 26 is displaying a graphical user interface (GUI) 36 having an array of icons 38. By way of example, when an icon 38 is selected either by an input device 14 or a touch sensing component of the electronic display 26, an application program may launch.

Furthermore, as depicted, input devices 14 open through the enclosure 34. As described above, the input devices 14 may enable a user to interact with the handheld electronic device 10A. For example, the input devices 14 may enable the user to activate or deactivate the handheld electronic device 10A, navigate a user interface to a home screen, navigate a user interface to a user-configurable application screen, activate a voice-recognition feature, provide volume control, and/or toggle between vibrate and ring modes. As depicted, the I/O ports 24 also open through the enclosure 34. In some embodiments, the I/O ports 24 may include, for example, a multi-function connector port (e.g., Lightning port) to connect to external devices.

Figure 3:
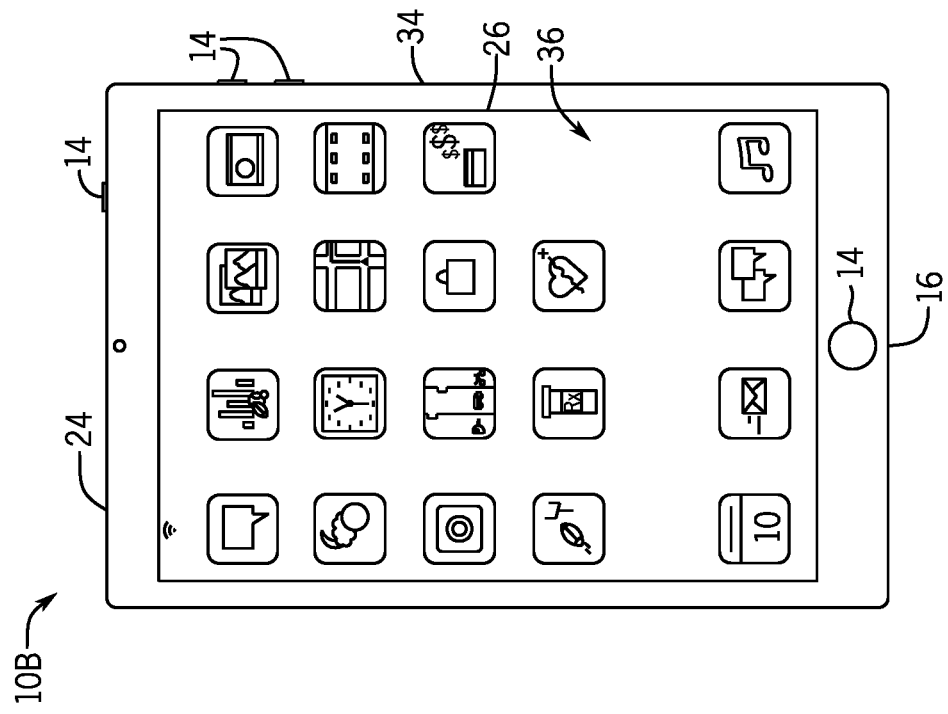
FIG. 3 is a front view of another hand-held device representing another example of the electronic device of FIG. 1, in accordance with an embodiment.
Figure 4:
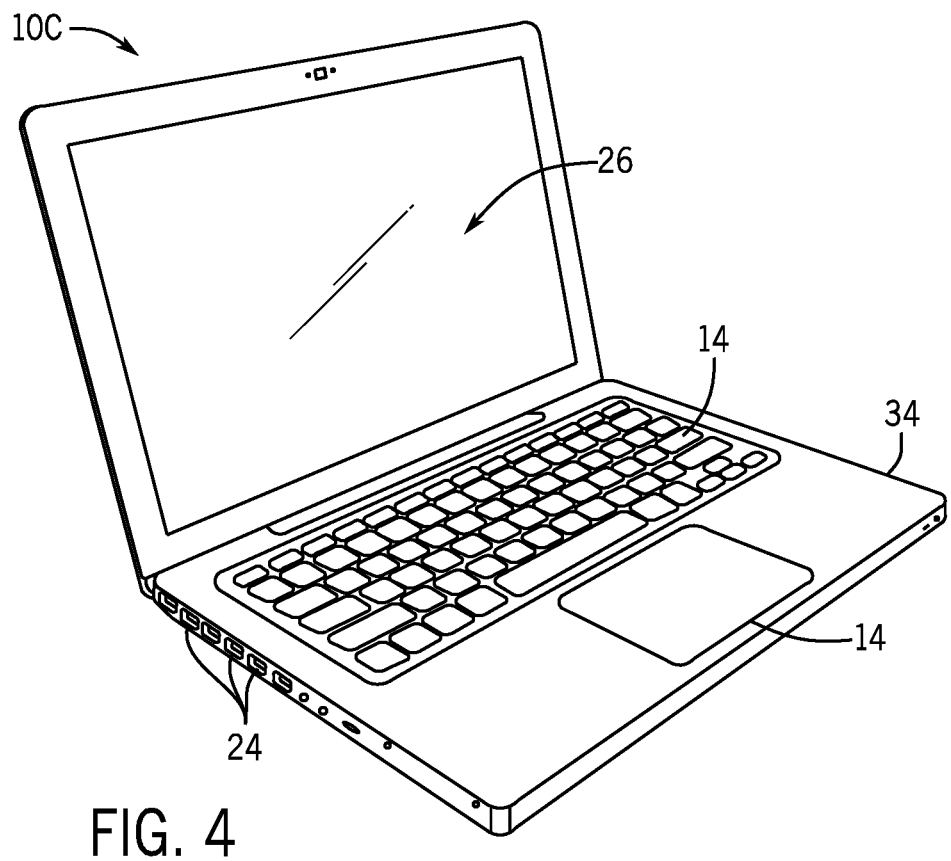
FIG. 4 is a perspective view of a notebook computer representing another example of the electronic device of FIG. 1, in accordance with an embodiment.
Figure 5:
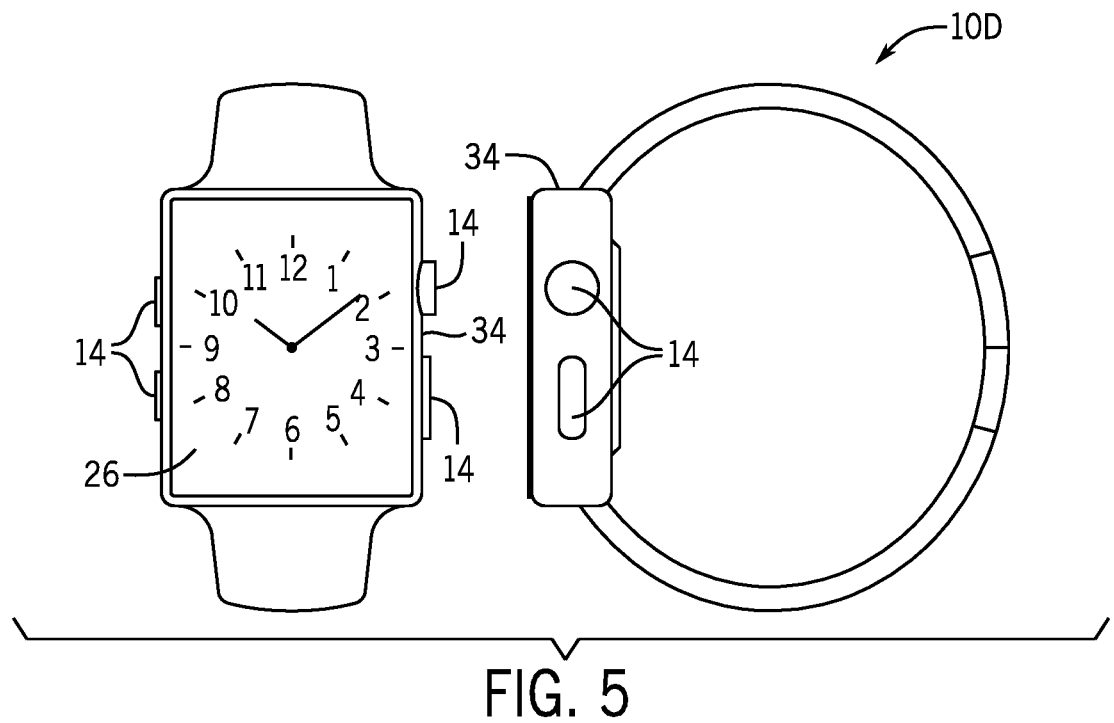
FIG. 5 is a front view of a wearable electronic device representing another example of the electronic device of FIG. 1, in accordance with an embodiment.

To further illustrate, another example of a suitable electronic device 10, specifically a tablet electronic device 10B is shown in FIG. 3. For example, the tablet electronic device 10B may be any iPad® model available from Apple Inc. A further example of a suitable electronic device 10, specifically a computer 10C, is shown in FIG. 4. For example, the computer 10C may be any Macbook® or iMac® model available from Apple Inc. Another example of a suitable electronic device 10, specifically a watch 10D, is shown in FIG. 5. For example, the watch 10D may be any Apple Watch® model available from Apple Inc.

As depicted, the tablet electronic device 10B, the computer 10C, and the watch 10D each also include an electronic display 26, input devices 14, I/O ports 24, and an enclosure 34. Thus, in some embodiments, the enclosure 34 may enclose a radio frequency system 12 in the tablet electronic device 10B, the computer 10C, and/or the watch 10D to facilitate wireless communication of data with other electronic devices and/or a network.

The components of the radio frequency system 12 may be tailored to support particular wireless technologies, such as millimeter-wave (mmWave) communication technology. In some embodiments, the radio frequency system 12 may implement phased array antennas, which include multiple transceiver blocks and a power amplifier per transceiver block, to transmit and/or receive wireless signals according to mmWave communication technology. Because of power amplifier gain variation due to environmental conditions and/or system parameters, the wireless signals may become distorted in an unexpected manner, such that the antenna circuitry 32 may not be able to fully compensate for the distortion. As such, the presently disclosed systems and techniques are related to mitigating distortion of wireless signals arising from variations in power amplifier gain by dynamically correcting the transmission gain based on input RX and output TX signal distortion information.

Figure 6:
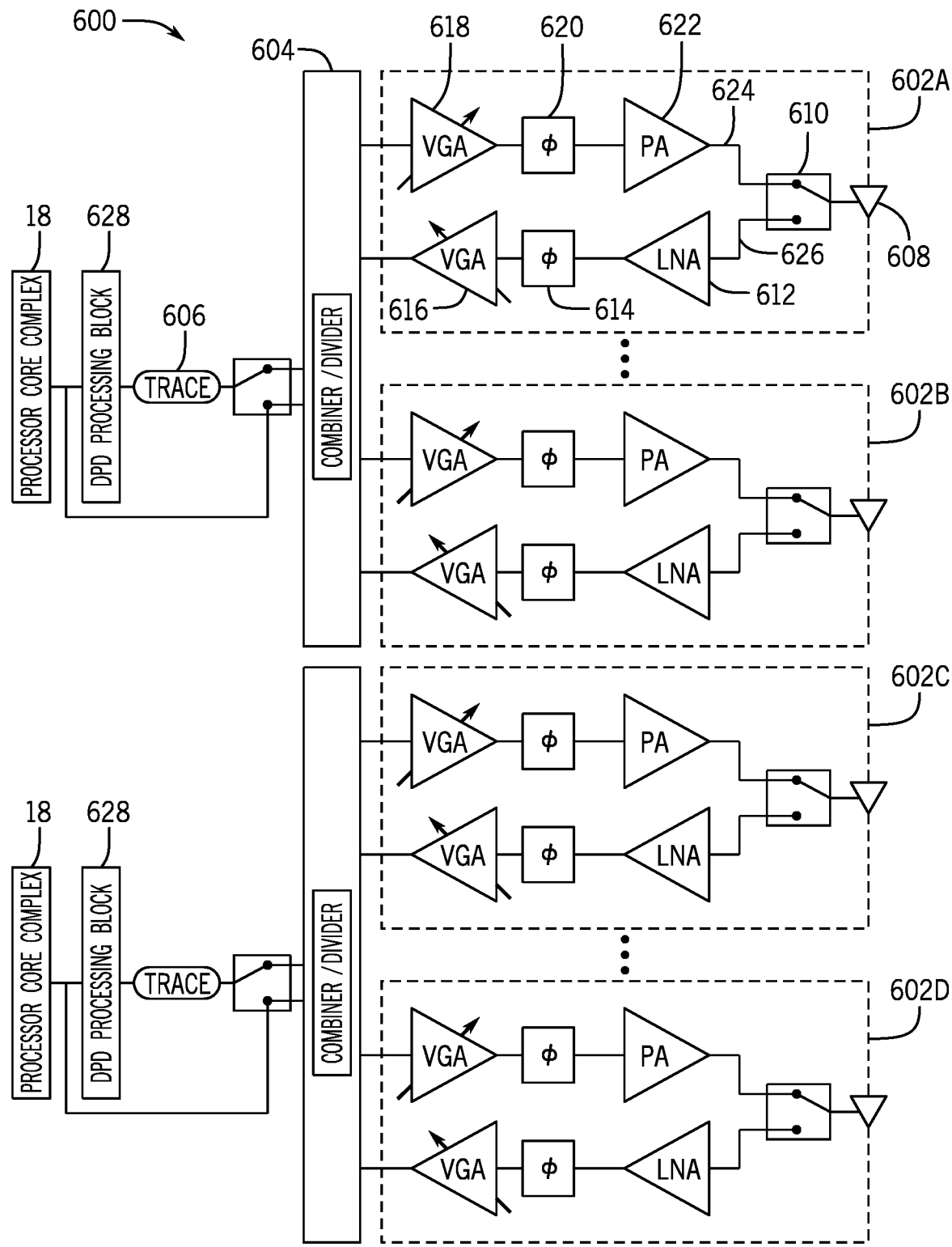
FIG. 6 is a schematic of a phased array antenna used in the radio frequency system of the electronic device of FIG. 1 to communicate with other electronic devices, in accordance with an embodiment.

To help illustrate, an example of a phased array antenna 600, which may be implemented in the radio frequency system 12 of an electronic device 10, is shown in FIG. 6. As depicted, the phased array antenna 600 may include multiple transceiver blocks 602A-D, antenna circuitry (e.g., power combiners/dividers) 604, and one or more cables/traces 606 used to transmit and/or receive wireless signals from the transceiver blocks 602A-D. It should be appreciated that the phased array antenna 600 may include a greater or fewer number of transceiver blocks 602A-D, power combiners/dividers 604, and/or traces 606 than depicted.

As shown, the phased array antenna 600 may include multiple transceiver blocks 602A-D that are each capable of transmitting and/or receiving wireless signals. Each transceiver block 602A-D may include an antenna 608 that facilitates transmission and/or reception of wireless signals, such as those communicated between electronic devices 10 using mmWave communication technology or any other suitable communication protocol. The antenna 608 may be coupled to a switch 610 that routes high frequency signals through radio frequency paths. For example, the switch 610 may couple to a transmission path 624 to enable transmission of amplified wireless signal to the antenna 608.

The transceiver block 602A-D may also include a reception path 626. In some embodiments, the reception path 626 may amplify a received wireless signal using an amplifier 612, such as a RX Low-Noise Amplifier (LNA). The amplifier 612 may amplify the input RX signal received via the antenna 608 without degrading its signal-to-noise ratio (e.g., amplifies power of both the wireless signal and input noise). The amplified RX signal may then pass through a phase shifter 614 that may remove phase information programmed into the RX signal during transmission from a different electronic device 10 that transmitted the RX signal. The RX signal may be further amplified by a variable-gain amplifier (VGA) 616, for example, to compensate for signal strength loss between the antenna 608 and the variable-gain amplifier 616 and/or in preparation for further processing.

The RX signal may then pass to power combiners/dividers 604 that includes power combiners and dividers (e.g., radio frequency splitters) and/or up-down converters. The power combiners/dividers 604 may demodulate the RX signal to facilitate further processing by the radio frequency system 12 and may modulate TX signals to ensure transmission on correct frequency bands. Traces 606 may transmit the RX signal to further radio frequency processing blocks, such as a one or more filters. The traces 606 may be designated as horizontal polarization traces or vertical polarization traces and are connected one at a time to the combiners/dividers 604. That is, the traces may be coupled to the power combiners/dividers 604 based on the polarization of the receiving and/or transmitting signal since electromagnetic waves are transmitted with alternating horizontal and vertical polarities. It should be appreciated that the power combiners/dividers 604 may instead include additional radio frequency processing blocks, such as the digital pre-distortion processing block.

The radio frequency system 12 may also transmit wireless signals pre-processing and post-processing. For example, a reference TX signal generated by the radio frequency system 12 may not be processed by a digital pre-distortion processing block 628 generally used to pre-distort output TX signals based on an expected amount of distortion by the power amplifier gain. The reference TX signal may thus encode reference information on distortion by the power amplifier gain. As an additional example, an output TX signal may be pre-compensated via the digital pre-distortion processing block 628 to pre-distort the output TX signal based on an expected amount of distortion by the power amplifier gain. After the output TX signal has been pre-distorted, the output TX signal may be transferred through the respective trace 606/power combiners and dividers 604 and to the variable-gain amplifier 618. The variable-gain amplifier 618 may amplify the output TX signal to compensate for expected strength loss during through the traces 606 and other cables. The output TX signal may then be modulated (e.g., phase shifted) using a TX phase shifter 620 that may work with other phase shifters of the phased array antenna 600 to form beams of wireless signals that can be steered in a particular direction, such as towards another electronic device 10.

Prior to transmission, a power amplifier 622 may amplify the output TX signal to help ensure that the output TX signal reaches the target electronic device 10. The power amplifiers 622 may operate in the non-linear region under deep compression (e.g., greater than 3 dB) to facilitate operation efficiency. Processing by the power amplifiers 622 may occur after processing by linearization techniques, such as the digital pre-distortion described above, since operation under deep compression results in a non-linear output that may distort the output TX signal and thus corrupt information carried by the output TX signal. The digital pre-distortion technique may correct the output TX signal based on a static model of expected distortion by power amplifier gain. For example, the expected distortion by power amplifier gain may be determined during the design process or during manufacturing and a static model may be generated based on this information.

Power amplifier gain, however, may vary during online operation of the radio frequency system 12 due to degradation of the power amplifier circuitry, impedance mismatching resulting in variations of the antenna reflection coefficient (VSWR), and variations in temperature. As such, the expected distortion may vary and linearization techniques, such as digital pre-distortion, may not fully pre-compensate for distortions of the output TX signal by the power amplifier 622. For example, when power amplifier gain is varied by +/−2 dB, the TX error vector magnitude (EVM) may increase from less than 1% to more than 5% as the power amplifier compression level shifts. The output TX signal may thus be encoded with information related to the distortion variation by the radio frequency system.

Adding real-time feedback capture between the output signal of the power amplifier 622 and the digital pre-distortion processing block to compensate for varying power amplifier gain may not be practical due to the physical spaced used to route wires and due to the losses associated with the wires. Further, because each power amplifier 622 of each transceiver block 602A-D may be driven with copies of the same output TX signal, a single digital pre-distortion function must linearize output TX signals to each power amplifier 622 according to the same function, something that is unlikely due to element-to-element variation. For example, each antenna 608 might present a different antenna reflection coefficient to its respective power amplifier 622 due to differences in impedance. Additionally, because the phased array antenna 600 may include multiple transceiver blocks 602A-D per chip instead of a single transceiver, simultaneous digital pre-distortion feedback of each transmitter element output to its input is difficult to implement due to feedback timing, distortion between the multiple transceiver blocks 602A-D, space constraints of the chip, and costs for implementing many (e.g., 16) feedback loops.

Figure 7:
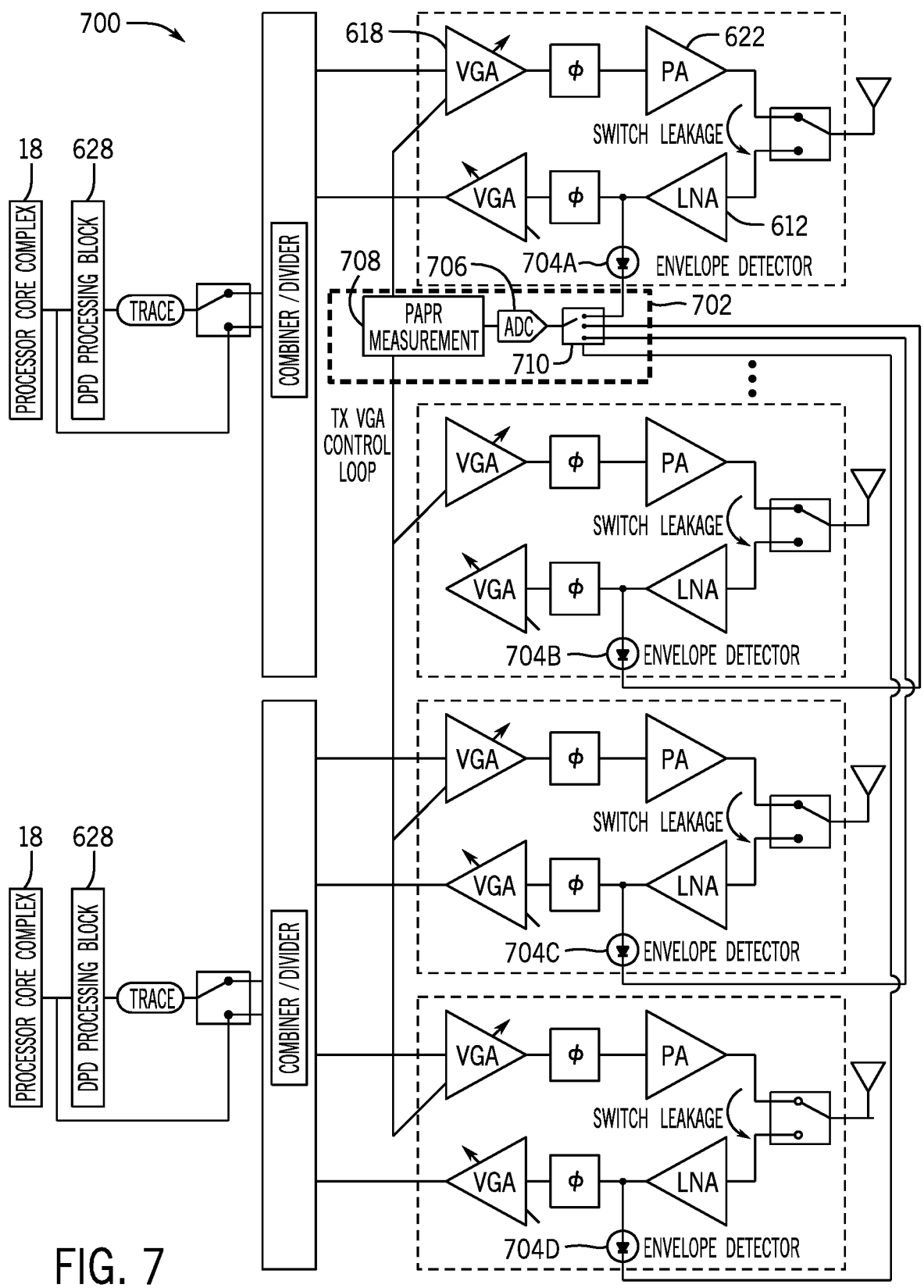
FIG. 7 is a schematic of a modified phased array antenna that mitigates distortion of wireless signals processed by the radio frequency system of the electronic device of FIG. 1, in accordance with an embodiment.

To mitigate distortion of wireless signals, the phased array antenna may be modified to correct for power amplifier gain variation such that factory-set digital pre-distortion techniques correct for signal distortion. As shown in FIG. 7, in some embodiments, the phased array antenna 700 may include a peak-to-average power ratio (PAPR) detection circuit 702 that includes an envelope detector (ED) 704A, an analog-to-digital converter (ADC) 706, and a peak-to-average power ratio measurement unit 708. In one embodiment, the envelope detector 704A may be placed after the amplifier (LNA) 612 to reduce loading of the power amplifier 622. The bandwidth of the envelope detectors 704A may allow the envelop detectors 704A to recover an envelope signal of high-frequency signals as opposed to other signal recovery detectors, such as root-mean-square (RMS) detectors. That is, the envelope detectors 704A may generate a smooth curve that follows the peaks of the high frequency signals (e.g., the output TX signal). It should be appreciated, that the connections of components of the transceiver block 602A-D and of the peak-to-average-power ratio detection circuitry 702 may vary from that depicted in FIG. 7.

The analog-to-digital converter 706 may generate a digital representation of the envelope signal that may be subsequently used by the peak-to-average power ratio measurement unit 708 to generate a peak-to-average power ratio of the envelope signal. The peak-to-average power ratio measurement unit 708 may compare this peak-to-average power ratio to a peak-to-average power ratio of a pre-digital pre-distortion signal (e.g., the reference TX signal) and may vary the gain of the variable-gain amplifier 618 to compensate for power amplifier gain variations based on the comparison results. By using the analog-to-digital converter 706, the phased array antenna 700 may avoid using prior knowledge of transmission signals as used in a full digital pre-distortion algorithm because calibration may instead be done by using control signals (e.g., the reference TX signal, the output TX signal).

As an example, the radio frequency system 12 may generate a reference TX signal that bypasses the digital pre-distortion block 628 and is transmitted to the antenna 608 of the transceiver block 602A. Because the reference TX signal may not be pre-distorted, the reference TX signal may encode reference information on the distortion by the power amplifier 622. Further, because the radio frequency system 12 may generate the reference TX signal, the distortion information (e.g., the reference peak-to-average power ratio) of the reference TX signal may already be stored in the processor core complex 18 and/or a modem.

Further, during a transmission operation, an output TX wireless signal may be pre-distorted by the digital pre-distortion block 628 prior to transmission along the transmission path 624. Pre-distortion may distort the output TX wireless signal based on an expected amount distortion by the power amplifier 622. The amplifier 612 may then receive a portion of the output TX signal as the output TX signal is being transmitted by the antenna 608 due to switch leakage via switch 610. The leakage signal may have been processed via the digital pre-distortion processing block and the power amplifier 622, as described above. Thus, the leakage signal may include information on the distortion caused by variations in the power amplifier gain that was not pre-compensated for by the digital pre-distortion processing block. The leakage signal may be amplified by the amplifier 612 and the envelope detector 706 may generate an envelope signal based on the leakage signal. The analog-to-digital converter 706 may convert the envelope signal into a digital representation that is used by the peak-to-average power measurement unit 708 to measure a peak-to-average-power ratio of the leakage signal. The peak-to-average power measurement of the leakage signal may reflect the compression level of the transceiver block 602A and may be independent of the leakage signal itself. That is, because the power amplifiers 622 operate with a constant supply voltage as opposed to in envelope tracker mode in which the supply voltage varies, there may be a direct correlation between the peak-to-average-power ratio measurement and the compression level that is independent of the actual signal.

As such, the peak-to-average power ratio measurement unit may then compare the peak-to-average ratio associated with the reference TX signal and stored by the processor core complex 18 to the ratio associated with the leakage signal to determine whether the compression levels are within an acceptable compression range. The radio frequency system 12 may vary the gain of the variable-gain amplifier 618 based on a simple state machine that compensates for variations in power amplifier gain that have shifted the compression level outside of the acceptable compression range. For example, with factory-set digital pre-distortion, the peak-to-average power ratio may expect to be a value of 5 dB at the TX output. However, a 4 dB compression measurement may indicate high compression levels and the radio frequency system 12 may adjust the gain of the variable-gain amplifier 618 to reduce overall gain compression.

Additionally, because the expected compression level and the peak-to-average power ratio is expected to remain the same regardless of the signal contents, a simple comparison between the reference distortion information (e.g., peak-to-average power ratio associated with the reference TX signal) and the distortion information of the output TX signal (e.g., peak-to-average power ratio associated with the leakage signal) may reveal whether there is excessive gain compression or gain expansion in the respective transceiver block 602A.

To provide similar comparison for other transceiver blocks 602B-602D, the transceiver blocks 602B-D may also include envelope detectors (e.g., 704B-D) that each generate an envelope signal associated with an output TX signal sent to their respective antennas 608. After compensating the first transceiver block (e.g., 602A), the switch 710 may couple the envelope detector (e.g., 704B) to the analog-to-digital converter 706. As such, the generated envelope signals of the other transceiver block (e.g., 602B) may be provided to the peak-to-average ratio measurement unit 708 to measure the peak-to-average power ratios associated with the other transceiver block's (e.g., 602B) output TX signal in a similar manner as that described above. Based on the difference between the peak-to-average power ratios of the reference TX signal and the respective output TX signal, the peak-to-average power ratio detection circuitry 702 may vary the gain of the respective variable-gain amplifier 618B. As such, each of the transceiver blocks 602A-D may be individually calibrated in a time-multiplexing manner during online operation to compensate for power amplifier gain variation of each transceiver block 602A-D.

Figure 8:
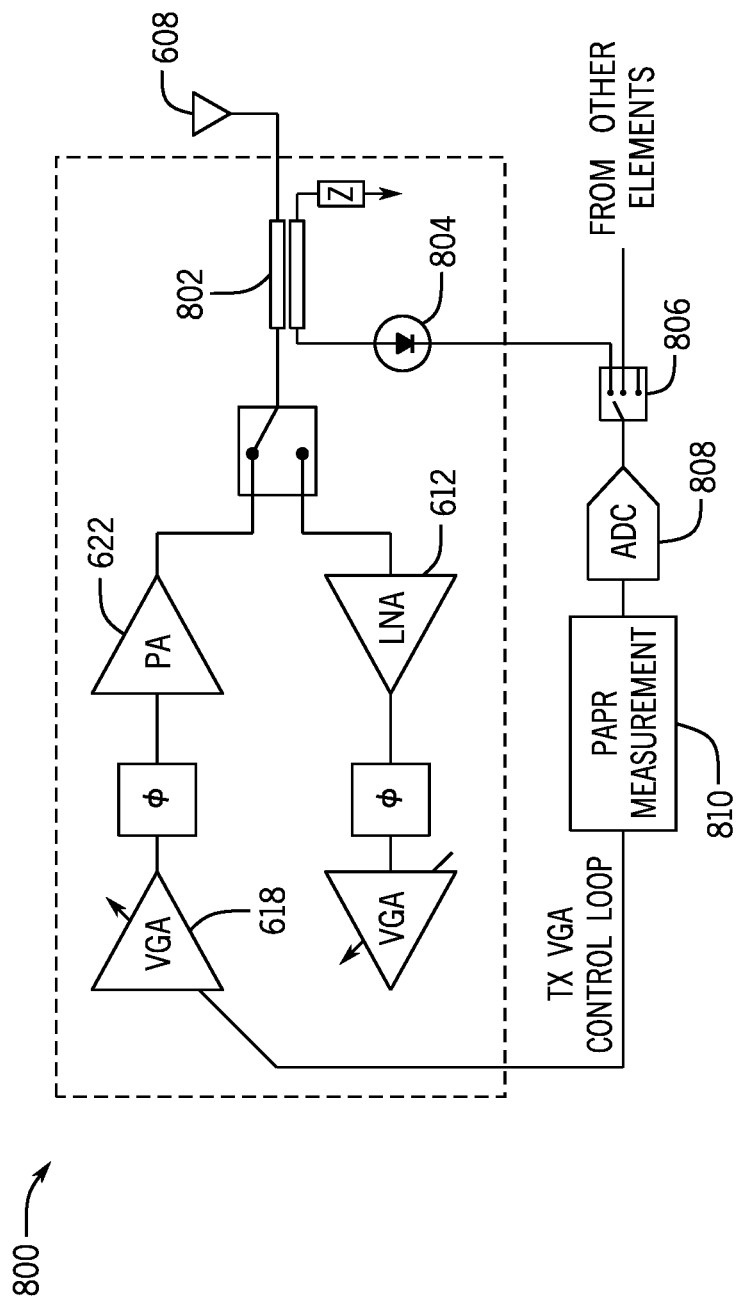
FIG. 8 is a schematic of an alternative modification to the phased array antenna of FIG. 7 to mitigate distortion of the wireless signals, in accordance with an embodiment.

FIG. 8 depicts an alternative embodiment 800 of the peak-to-average power ratio detection circuit that may be used to determine and mitigate wireless signal distortion. That is, in one embodiment, a bi-directional coupler 802 may couple a signal in a transmission line to other electrical components such that the signal may be used by another circuit. For example, the bi-directional coupler 802 may transfer a portion of the output TX signal to the peak-to-average power ratio detection circuitry 702 for distortion measurement as the output TX signal passes through the directional coupler 802 on the way to the antenna 608. In a similar manner as that described above, the alternative embodiment 800 may determine distortion information (e.g., peak-to-average power ratios) associated with an output TX signal to determine the compression levels. Further, the radio frequency system 12 may vary the gain of the variable-gain amplifier 618 based on the determined distortion information.

Figure 9:
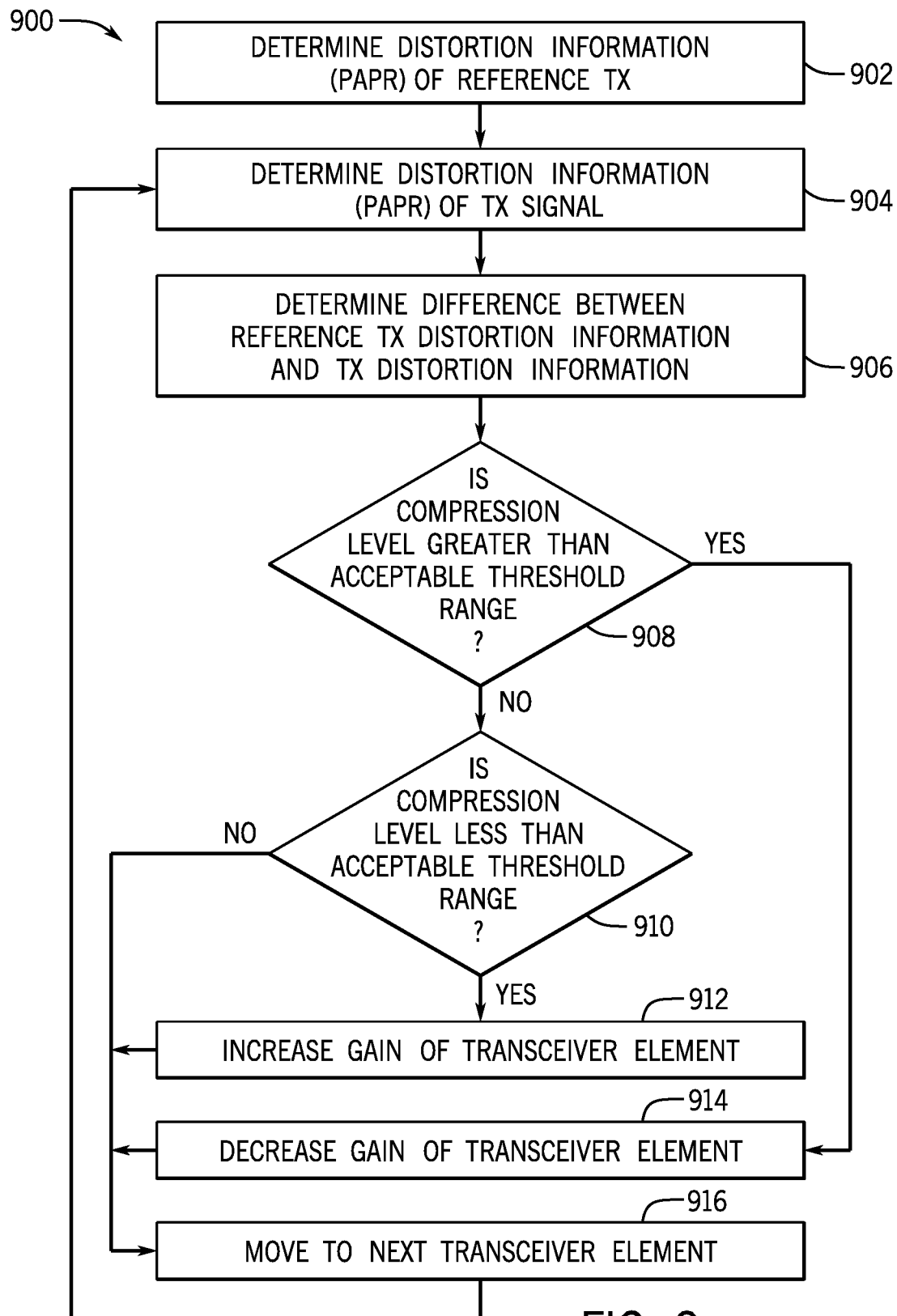
FIG. 9 is a flow chart of a process for operating the modified phased array antennas of FIG. 7 and FIG. 8 to prevent distortion of the wireless signal, in accordance with an embodiment.

A process 900 for compensating for variations in the power amplifier gain is described in FIG. 9, in accordance with an embodiment. While process 900 is described according to a certain sequence, it should be understood that the present disclosure contemplates that the described steps may be performed in different sequences than the sequence illustrated, and certain described steps may be skipped or not performed altogether. In some embodiments, the process 900 may be implemented at least in part by executing instructions stored in a tangible, non-transitory, computer-readable medium, such as the memory 20, using processing circuitry, such as the processor core complex 18 or a separate controller designated for the radio frequency system. Additionally or alternatively, the process 900 may be implemented at least in part by circuit connections and/or control logic implemented in an electronic device 10.

Generally, the process 900 is initiated by determining the distortion information of the reference TX signal (process block 902). As discussed above, the processor core complex 18 may instruct the peak-to-average power ratio detection circuit 702 to determine a peak-to-average power ratio of the reference TX signal (process block 902). This peak-to-average power ratio may act as a control since the reference TX signal has not been pre-distorted to compensate for potential distortion by the power amplifier 622. Additionally, the processor core complex 18 may instruct the peak-to-average power ratio detection circuit 702 to determine distortion information associated with the output TX signal (process block 904). The distortion information may be a peak-to-average power ratio of an envelope signal associated with the output TX signal that is determined by taking the ratio between the peak power (e.g., peak amplitude squared) and the root-mean squared value (e.g., average power). This peak-to-average power ratio may act as provide distortion variation information since the output TX signal may have been processed by the digital pre-distortion processing block and the power amplifier 622. As such, this peak-to-average power ratio may reflect changes in compression levels due to variations in power amplifier gain.

The processor may then determine a difference between the reference TX distortion information and the TX distortion information to evaluate the change to compression levels of a transceiver block (e.g., 602A) (process block 906). Based on the comparison result, the processor may determine whether the compression level is greater than an acceptable compression threshold range (decision block 908). If the compression level is greater than acceptable, the processor may instruct the peak-to-average power ratio detection circuit 702 to decrease the gain of the transceiver block (e.g., 602A) by decreasing the gain of the TX Variable-Gain Amplifier 618 (process block 914). That is, a TX peak-to-average power ratio smaller than the reference peak-to-average power ratio indicates that the gain was greater than expected and the digital pre-distortion correction resulted in a gain compression. As such, the gain of the transceiver block (e.g., 602A) should be decreased. In some embodiments, the acceptable compression threshold range is the minimum gain step of the variable-gain amplifier 618.

If the compression level is not greater than the acceptable compression threshold range, the processor may determine whether the compression level is less than the acceptable compression threshold range (decision block 910). When the compression level is less than acceptable, the processor may indicate to the peak-to-average power ratio detection circuit 702 to increase the gain of the transceiver block (e.g., 602A) (process block 912). In other words, when the TX peak-to-average power ratio is greater than the reference peak-to-average power ratio, the output TX signal is being compressed less than expected by the transceiver block (e.g., 602A). As such, the gain of the variable-gain amplifier 618 may be increased to increase the overall gain compression by the transceiver block (e.g., 602A).

When the compression level is within the acceptable compression threshold range, no modification to the transceiver block's (e.g., 602A) gain is needed. Thus, the process 900 may repeat for the next transceiver block (e.g., 602B) in a time-multiplexing fashion until each transceiver block 602A-D has been compensated for power amplifier gain variations (process block 916).

By employing the techniques described above, the radio frequency system 12 may compensate for wireless signal distortion due to undesired gain compression and/or gain expansion. The present techniques provide compression distortion compensation even in instances where there are operational and fabrication variations between multiple transceiver blocks 602A-D. Further, the techniques compensate for signal distortion in a cost-effective and space-effective manner as compared to techniques that employ full pre-compensation processes, such as full digital pre-distortion techniques, and/or feedback loops to the processing circuitry.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. An electronic device comprising a radio frequency system configured to wirelessly transmit and receive data, wherein the radio frequency system comprises:
    transceiver circuitry configured to transmit and receive the data;
    an envelope detector configured to:
        generate an envelope signal based on a signal being transmitted by the transceiver circuitry; and
    a distortion detection circuit configured to couple to the transceiver circuitry, wherein the distortion detection circuit comprises:
    an analog-to-digital converter (ADC) circuit configured to digitize the envelope signal;
    a peak-to-average power ratio (PAPR) circuit configured to:
        determine a first peak-to-average ratio of the digitized envelope signal;
        receive a second peak-to-average ratio of a reference signal from a processor;
        determine a difference between the first peak-to-average ratio to the second peak-to-average ratio; and
        adjust a gain of a power amplifier configured to amplify the signal prior to transmission based on the difference.

2. The electronic device of claim 1, wherein the radio frequency system is configured to generate the reference signal with the second peak-to-average ratio and store the second peak-to-average ratio in the processor.

3. The electronic device of claim 1, wherein the signal comprises leakage current conducted via a switch configured to control whether the transceiver circuitry receives the data or transmits the data.

4. The electronic device of claim 1, wherein the signal comprises current conducted via a bi-directional coupler configured to control whether the transceiver circuitry receives the data or transmits the data.

5. The electronic device of claim 1, comprising additional transceiver circuitry, wherein the additional transceiver circuitry comprises an additional envelope detector configured to:
    generate an additional envelope signal based on an additional signal being transmitted by the additional transceiver circuitry; and
    transmit the additional envelope signal to the PAPR circuit, wherein the PAPR circuit is configured to adjust an additional gain of an additional amplifier of the additional transceiver circuitry based on the additional envelope signal and the reference signal.

6. The electronic device of claim 5, wherein the PAPR circuit comprises a switch configured to receive the envelope signal and the additional envelope signal according to a time-multiplexing scheme.

7. A circuit, comprising:
an analog-to-digital converter (ADC) circuit configured to digitize an envelope signal received from an envelope detector, wherein the envelope detector is configured to generate the envelope signal based on a signal being transmitted by a transceiver circuitry;
a peak-to-average power ratio (PAPR) circuit configured to:
  determine a first peak-to-average ratio of the digitized envelope signal;
  receive a second peak-to-average ratio of a reference signal from a processor;
  determine a difference between the first peak-to-average ratio to the second peak-to-average ratio; and
  adjust a gain of a power amplifier configured to amplify the signal prior to transmission based on the difference.

8. The circuit of claim 7, wherein the signal is transmitted by the transceiver circuitry using an antenna.

9. The circuit of claim 8, wherein the signal comprises leakage current conducted via a switch configured to transmit the signal via the antenna.

10. The circuit of claim 8, wherein the envelope detector is configured to generate the envelope signal based on a current associated with the signal transmitted via a bi-directional coupler configured to couple the antenna to the envelope detector.

11. The circuit of claim 8, wherein the second peak-to-average ratio of the reference signal is stored in the processor.

12. The circuit of claim 7, wherein the ADC circuit is configured to digitize an additional envelope signal received from an additional envelope detector associated with additional transceiver circuitry.

13. The circuit of claim 12, wherein the ADC circuit is configured to receive the envelope signal and the additional envelope signal via a time-multiplexing switch.

14. A method, comprising:
generating, via a circuit, a reference signal, wherein the reference signal is configured to not be pre-distorted by a processing block;
receiving, via a distortion detection circuit, an envelope signal representative of a signal being transmitted by a transceiver;
determining, via the distortion detection circuit, a first peak-to-average ratio of the envelope signal;
receiving, via the distortion detection circuit, a second peak-to-average ratio of the reference signal;
determining, via the distortion detection circuit, a difference between the first peak-to-average ratio and the second peak-to-average ratio; and
adjusting, via the distortion detection circuit, a gain of an amplifier of the transceiver based on the difference.

15. The method of claim 14, wherein adjusting the gain of the amplifier comprises decreasing the gain of the amplifier in response to the difference being greater than a first threshold, wherein the amplifier is configured to amplify the signal prior to being transmitted.

16. The method of claim 14, wherein adjusting the gain of the amplifier comprises increasing the gain of the amplifier in response to the difference being less than a second threshold, wherein the amplifier is configured to amplify the signal prior to being transmitted.

17. The method of claim 14, comprising:
receiving, via the distortion detection circuit, an additional envelope signal representative of an additional signal being transmitted by an additional transceiver;
determining, via the distortion detection circuit, a third peak-to-average ratio of the additional envelope signal;
determining, via the distortion detection circuit, a difference between the second peak-to-average ratio and the third peak-to-average ratio; and
adjusting, via the distortion detection circuit, an additional gain of an additional amplifier of the additional transceiver based on the difference.

18. The method of claim 17, wherein the envelope signal and the additional envelope signal are received in a time-multiplexing scheme.

19. The method of claim 14, comprising:
generating, via an envelope detector circuit, the envelope signal based on a current associated with the signal, wherein the current is conducted via a switch configured to transmit the signal via an antenna, or conducted via a bi-directional coupler configured to transmit the signal via the antenna.

20. The method of claim 14, wherein adjusting the gain of the amplifier based on the difference occurs in response to determining that the difference is outside a range of values.

* * * * *